United States Patent
Liu et al.

(10) Patent No.: US 9,508,762 B2
(45) Date of Patent: Nov. 29, 2016

(54) ARRAY SUBSTRATE, METHOD OF MANUFACTURING ARRAY SUBSTRATE AND DISPLAY DEVICE

(71) Applicant: BOE Technology Group Co., Ltd., Beijing (CN)

(72) Inventors: Wei Liu, Beijing (CN); Chunsheng Jiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/068,928

(22) Filed: Mar. 14, 2016

(65) Prior Publication Data

US 2016/0300869 A1 Oct. 13, 2016

(30) Foreign Application Priority Data

Apr. 10, 2015 (CN) .......................... 2015 1 0171291

(51) Int. Cl.

| | | |
|---|---|---|
| H01L 21/00 | (2006.01) | |
| H01L 27/12 | (2006.01) | |
| H01L 29/66 | (2006.01) | |
| H01L 29/786 | (2006.01) | |
| H01L 29/06 | (2006.01) | |
| H01L 21/473 | (2006.01) | |
| H01L 21/471 | (2006.01) | |
| H01L 21/475 | (2006.01) | |
| H01L 29/45 | (2006.01) | |
| H01L 29/49 | (2006.01) | |

(52) U.S. Cl.
CPC ......... *H01L 27/1296* (2013.01); *H01L 21/471* (2013.01); *H01L 21/473* (2013.01); *H01L 21/475* (2013.01); *H01L 27/1225* (2013.01); *H01L 29/0649* (2013.01); *H01L 29/45* (2013.01); *H01L 29/495* (2013.01); *H01L 29/66969* (2013.01); *H01L 29/78693* (2013.01)

(58) Field of Classification Search
CPC ................ C09K 11/06; C09K 11/025; C09K 2211/1007; C09K 2211/185; H01L 51/0085
USPC ............................................ 438/104; 257/43
See application file for complete search history.

(56) References Cited

U.S. PATENT DOCUMENTS

| | | | | |
|---|---|---|---|---|
| 8,319,223 | B2* | 11/2012 | Kim | .................... H01L 51/0545 257/40 |
| 2012/0181532 | A1* | 7/2012 | Lin | ..................... H01L 29/7869 257/43 |
| 2015/0171111 | A1* | 6/2015 | Hong | ................ H01L 29/66969 257/43 |

*Primary Examiner* — Andy Huynh
(74) *Attorney, Agent, or Firm* — Westman, Champlin & Koehler, P.A.

(57) ABSTRACT

Embodiments of the present invention disclose an array substrate, a method of manufacturing an array substrate and a display device, which belong to field of display technology. The method includes: forming a gate metal pattern and a gate insulating layer in turn on a base substrate; forming a source-drain metal pattern that is made of a preset metal on the base substrate, on which the gate insulating layer is formed, the source-drain metal pattern comprising a source electrode and a drain electrode and the preset metal including at least copper; forming a silicon nitride layer and a silicon oxide layer in turn on the base substrate, which compose a passivation layer; forming a trench in the passivation layer at a position corresponding to a gap between the source electrode and the drain electrode, wherein a width of the trench in the silicon oxide layer is smaller than a width of the trench in the silicon nitride layer and is larger than or equal to a distance of the gap between the source electrode and the drain electrode; forming an oxide trench pattern on the source-drain metal pattern, with is not in contact with the silicon nitride layer. The present invention solves problems of high-degree oxidation of copper metal layer and poorer display performance of an existing array substrate, and achieves advantages of reducing oxidation of copper metal layer and improving display performance of the array substrate for a display device.

9 Claims, 7 Drawing Sheets

ARRAY SUBSTRATE, METHOD OF MANUFACTURING ARRAY SUBSTRATE AND DISPLAY DEVICE

CROSS-REFERENCE TO RELATED APPLICATIONS

This application claims priority of Chinese Application No. 201510171291.5, filed Apr. 10, 2015, entitled "Array Substrate, Method of Manufacturing Array Substrate and Display Device", which is incorporated herein by reference in their entirety.

BACKGROUND

Technical Field

The invention relates to field of display technology, and particularly to an array substrate, a method of manufacturing the array substrate and a display device.

Description of the Related Art

Organic Light-Emitting Diode (OLED) is a current mode semiconductor Light-Emitting device based on an organic material. Recently, a display device which is characterized in including OLED has been developed to have a large size, a high resolution and a fast response. In order to reduce cost and improve displaying quality of a display panel, an oxide thin film transistor (TFT) array substrate, which is formed in a copper+oxide coplanar structure, is approached. As copper is used to form source and drain electrodes, the array substrate has advantages including low wire resistance, good conductive effect, lower voltage drop and lower process complexity in a large-size display panel, etc., and thus is widely concerned.

The existing oxide TFT array substrate formed in a copper+oxide coplanar structure has a configuration as shown in FIG. 1. The array substrate includes a base substrate 1001, a gate metal pattern 1002 formed on the base substrate 1001, a gate insulating layer 1003 formed over the gate metal pattern 1002, a source-drain metal pattern 1004 formed by depositing a source-drain metal (which is copper) on the gate insulating layer 1003 and patterning it, an oxide trench pattern 1005 formed by depositing an oxide active layer and patterning it, and a conventional passivation layer (PVX) 1006 and an organic film 1007 formed over the oxide trench pattern 1005, in which the PVX has a double-layer structure generally including a silicon oxide (SiOx) layer and a silicon nitride (SiNx) layer.

In this array substrate, the source-drain metal pattern 1004 is formed by the source-drain metal in a double-layer structure and has a thinner lower barrier layer, which is made of molybdenum-niobium alloy, and an upper copper metal layer. However, as the oxide trench pattern 1005 is located on the upper copper metal layer, the copper metal layer is completely exposed to an oxygen enriched environment and thus tends to be oxidized. Meanwhile, as shown in FIG. 1, when the lower layer of the PVX 1006 is SiOx and the upper layer is SiNx, the SiOx that is in contact with the source-drain metal pattern 1004 will accelerate oxidation of the copper metal layer. Otherwise, when the lower layer of the PVX 1006 is SiNx and the upper layer is SiOx, hydrogen (H) element in SiNx that is in contact with the oxide trench pattern 1005 will adversely affect the oxide trench pattern 1005, resulting in a large current phenomenon in the array substrate. In this instance, the copper metal layer will be oxidized to a large extent and the array substrate has a worse display performance.

SUMMARY

In order to solve problems of rather serious oxidation of copper metal layer and poorer display performance of the array substrate, the disclosure provides an array substrate, a method of manufacturing an array substrate and a display device. The technical schemes include the following:

As a first aspect, there is provided a method of manufacturing an array substrate, the method comprising steps of:

forming a gate metal pattern and a gate insulating layer in turn on a base substrate;

forming a source-drain metal pattern from a preset metal on the base substrate, on which the gate insulating layer is formed, the source-drain metal pattern comprising a source electrode and a drain electrode and the preset metal comprising at least copper;

forming a silicon nitride layer and a silicon oxide layer in turn on the base substrate, on which the source-drain metal pattern is formed, the silicon nitride layer and the silicon oxide layer composing a passivation layer;

forming a trench in the passivation layer at a position corresponding to a gap between the source electrode and the drain electrode, wherein a width of the trench in the silicon oxide layer is smaller than a width of the trench in the silicon nitride layer and is larger than or equal to a distance of the gap between the source electrode and the drain electrode;

forming an oxide trench pattern on the source-drain metal pattern, the oxide trench pattern being not in contact with the silicon nitride layer;

forming a resin film on the base substrate, on which the oxide trench pattern is formed.

Preferably, the step of forming a trench in the passivation layer at a position corresponding to a gap between the source electrode and the drain electrode includes:

coating a photoresist on the base substrate, on which the passivation layer is formed;

performing exposure and development on the gap between the source electrode and the drain electrode through the photoresist to obtain a trench pattern;

forming the trench in the passivation layer by etching the passivation layer;

the method further includes:

after forming the oxide trench pattern on the source-drain metal pattern, peeling off the photoresist.

Preferably, the step of forming a trench in the passivation layer by etching the passivation layer includes:

forming a trench in the passivation layer by performing a dry etching process in the passivation layer.

Preferably, the step of forming a source-drain metal pattern that is made of a preset metal on the base substrate, on which the gate insulating layer is formed, includes:

forming a barrier layer on the base substrate, on which the gate insulating layer is formed;

forming a copper metal layer on the base substrate, on which the barrier layer is formed;

forming the source-drain metal pattern in the barrier layer and the copper metal layer.

Preferably, the barrier layer is made of molybdenum-niobium alloy.

As a second aspect, there is provided an array substrate, comprising:

a base substrate;

a gate metal pattern and a gate insulating layer formed on the base substrate;

a source-drain metal pattern made of preset metal and formed on the base substrate, on which the gate insulating layer is formed, the source-drain metal pattern including a source electrode and a drain electrode and the preset metal including at least copper;

a silicon nitride layer and a silicon oxide layer formed in turn on the base substrate, on which the source-drain metal pattern is formed, the silicon nitride layer and the silicon oxide layer composing a passivation layer;

a trench which is formed in the passivation layer at a position corresponding to a gap between the source electrode and the drain electrode, wherein a width of a trench in the silicon oxide layer is smaller than width of a trench in the silicon nitride layer and is larger than or equal to a distance of the gap between the source electrode and the drain electrode;

an oxide trench pattern which is formed on the source-drain metal pattern and is not in contact with the silicon nitride layer; and a resin film, formed on the base substrate, on which the oxide trench pattern is formed.

Preferably, a barrier layer is formed on the base substrate, on which the gate insulating layer is formed;

a copper layer is formed on the base substrate, on which the barrier layer is formed;

the barrier layer and the copper layer are formed with the source-drain metal pattern.

Preferably, the barrier layer is made of molybdenum-niobium alloy.

As a third aspect, there is provided a display device, comprising any of the array substrates according to the second aspect.

Embodiments of the present invention provides an array substrate, a method of manufacturing an array substrate and a display device, which avoid the copper metal layer from being completely exposed to an oxygen enriched environment to be oxidized and ensure the copper metal layer to be not in contact with the silicon oxide layer, thereby reducing or eliminating oxidation of the copper metal layer, by firstly forming the passivation layer on the source-drain metal pattern and then forming the oxide trench pattern, and by further modifying the structure of the passivation layer to include the silicon nitride layer as the lower layer and the silicon oxide layer as the upper layer. Further, it may ensure the oxide trench pattern to be not in contact with the silicon oxide layer, avoid influence on display characteristic of the array substrate, and thus reduce or eliminate oxidation of the copper metal layer and improve display performance of the array substrate, by forming the trench in the passivation layer at a position corresponding to the gap between the source electrode and the drain electrode, such that the width of the trench in the silicon oxide layer is smaller than the width of the trench in the silicon nitride layer and is larger than or equal to the width of the gap between the source electrode and the drain electrode.

It is understood that the above general description and the following detailed description are only illustrative and explanatory, but not limitative to the present invention.

BRIEF DESCRIPTION OF THE DRAWINGS

In order to more explicitly illustrate technical schemes of embodiments of the present invention, the drawings that are required during describing the embodiments are briefly introduced below. It is obvious for those skilled in the art the below Figures illustrate only some embodiments of the present invention and other Figures may be obtain based on these Figures without inventive labour.

Embodiments of the present invention have been explicitly illustrated by the above drawings and will be further described in the following description. These Figures and their description are not intended to limit the scope of the inventive concept in any way, but are aimed to interpret the concept of the present invention to those skilled in the art by referring to specific embodiments.

DETAILED DESCRIPTION OF EMBODIMENTS

Embodiments of the present invention will be further described in detail in combination with drawings in order that objects, technical schemes and advantages of the present invention will be more explicit.

Figure 1:
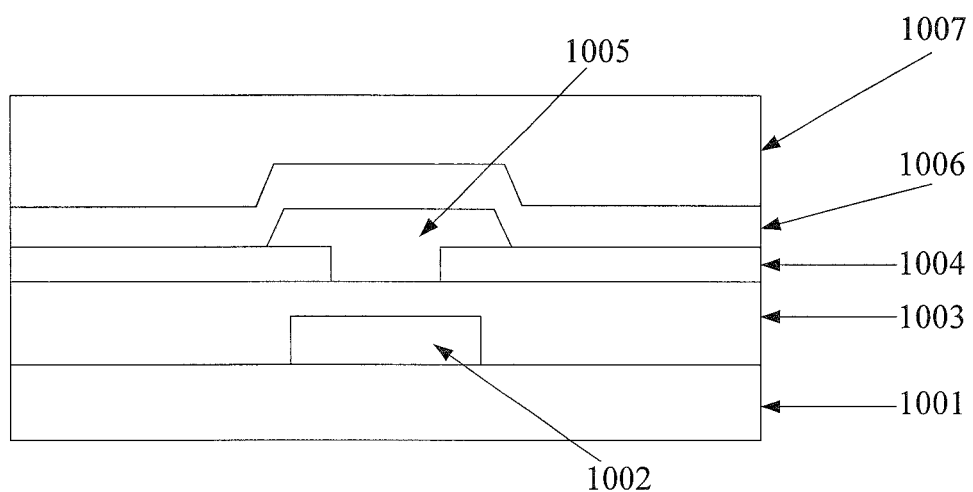
FIG. 1 is a schematic structural view of an existing array substrate.
Figure 2:
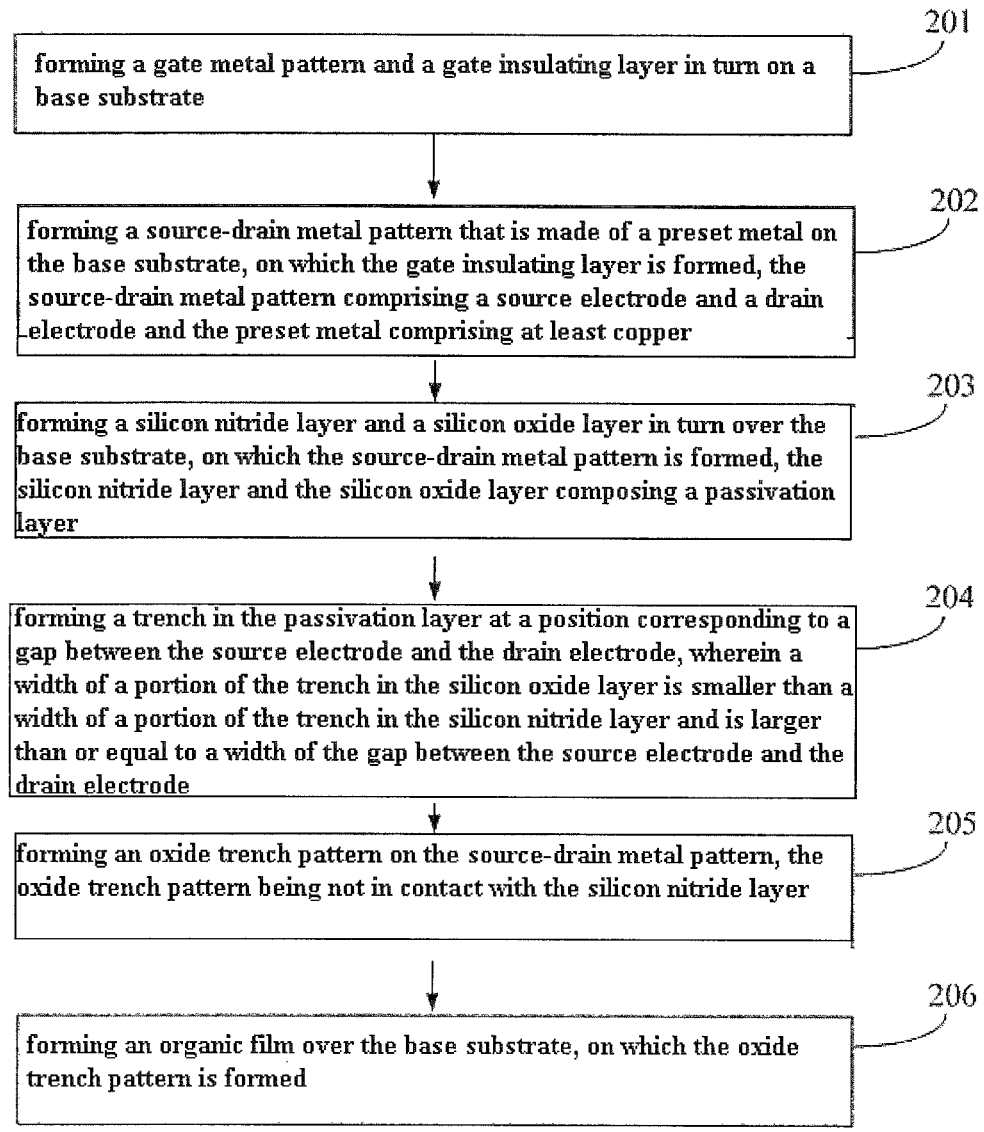
FIG. 2 is a flow chart of a method of manufacturing an array substrate according to an embodiment of the present invention.

Embodiments of the present invention provide a method of manufacturing an array substrate, as shown in FIG. 2, the method comprising:

Step 201: forming a gate metal pattern and a gate insulating layer in turn on a base substrate;

Step 202: forming a source-drain metal pattern that is made of a preset metal on the base substrate, on which the gate insulating layer is formed, the source-drain metal pattern comprising a source electrode and a drain electrode and the preset metal comprising at least copper;

Step 203: forming a silicon nitride layer and a silicon oxide layer in turn over the base substrate, on which the source-drain metal pattern is formed, the silicon nitride layer and the silicon oxide layer composing a passivation layer;

Step 204: forming a trench in the passivation layer at a position corresponding to a gap between the source electrode and the drain electrode, wherein a width of a portion of the trench in the silicon oxide layer is smaller than a width of a portion of the trench in the silicon nitride layer and is larger than or equal to a width of the gap between the source electrode and the drain electrode;

Step 205: forming an oxide trench pattern on the source-drain metal pattern, the oxide trench pattern being not in contact with the silicon nitride layer; and Step 206: forming an organic film over the base substrate, on which the oxide trench pattern is formed.

In sum, the method of manufacturing an array substrate according to embodiments of the present invention may avoid the copper metal layer from being completely exposed to an oxygen enriched environment and ensure the copper metal layer to be not in contact with the silicon oxide layer, thereby eliminating oxidation of the copper metal layer, by firstly forming the passivation layer on the source-drain metal pattern and secondly forming the oxide trench pattern and by modifying the structure of the passivation layer such that the silicon nitride layer is provided as the lower layer and the silicon oxide layer is provided as the upper layer. Further, the method may ensure the oxide trench pattern to be not in contact with the silicon oxide layer, avoid adverse influence on display characteristic of the array substrate, and thus eliminate oxidation of the copper metal layer and improve display performance of the array substrate by forming the trench in the passivation layer at a position corresponding to the gap between the source electrode and the drain electrode, in which the width of the trench in the silicon oxide layer is smaller than the width of the trench in the silicon nitride layer and is larger than or equal to the width of the gap between the source electrode and the drain electrode.

Figure 3:
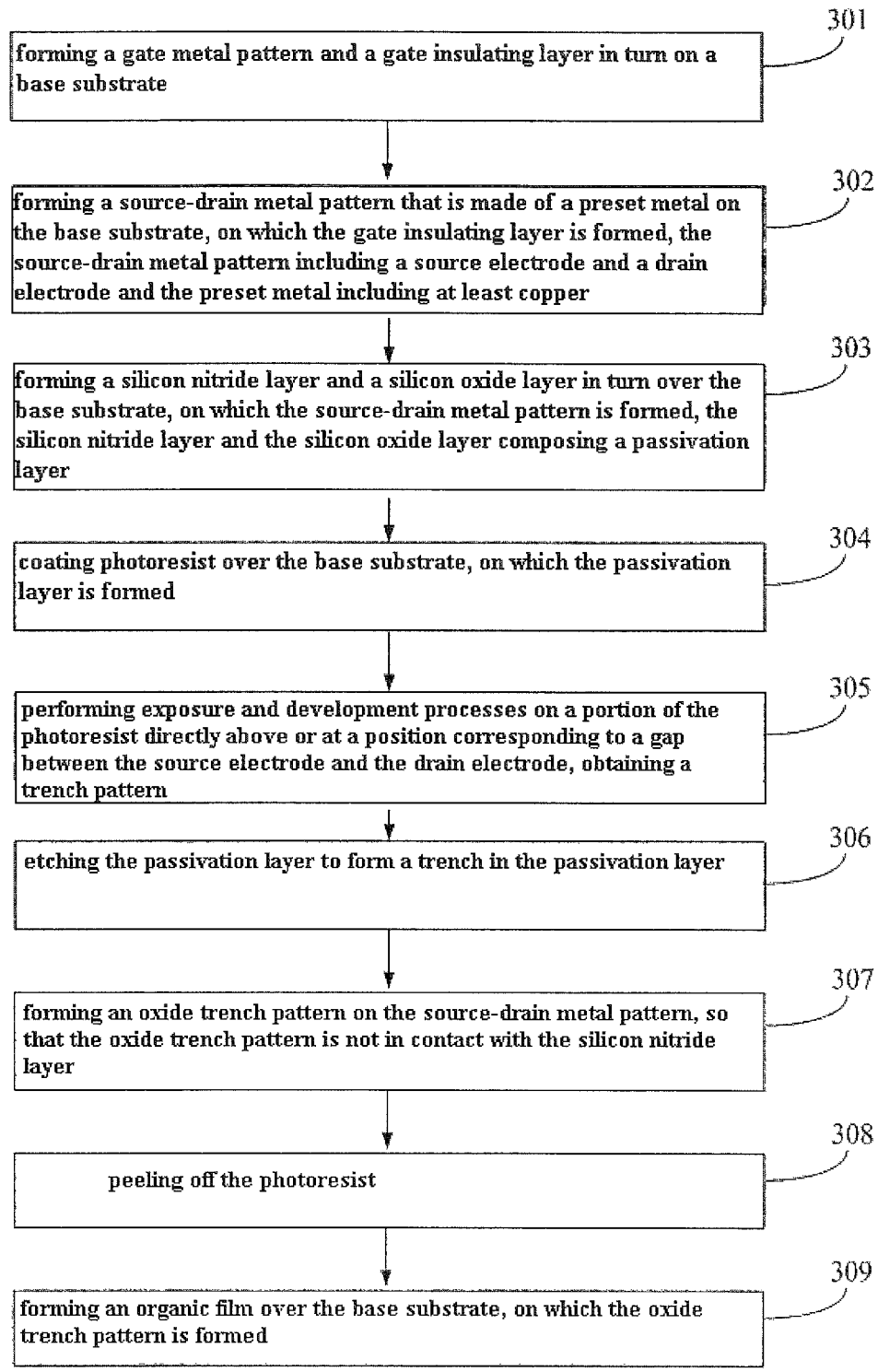
FIG. 3 is a flow chart of a method of manufacturing an array substrate according to another embodiment of the present invention.
Figure 4:
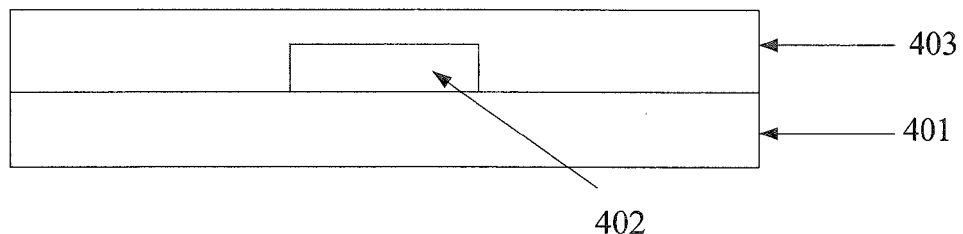
FIG. 4 is a schematic structural view showing processes of manufacturing a gate metal pattern and a gate insulating layer according to an embodiment of the present invention.

Embodiments of the present invention provide another method of manufacturing an array substrate, as shown in FIG. 3, the method comprising following steps:

Step 301: forming a gate metal pattern and a gate insulating layer in turn on a base substrate;

In an example, as shown in FIG. 4, a gate metal pattern 402 and a gate insulating layer 403 are formed in turn on a base substrate 401. As an example, a magnetron sputtering process may be used to form a layer of metal film on the base substrate 401 by using a metal material, which may be any one of molybdenum, aluminium, aluminum-nickel alloy, molybdenum-tungsten alloy, chromium and copper, or a combination thereof. Then, the gate metal pattern 402 is formed on the base substrate 401 by processing the layer of metal film through processes such as exposure by means of a mask, development, etching, peel-off, and the like. The gate insulating layer 403 may be formed on the base substrate 401, on which the gate metal pattern 402 is formed, for example, by a chemical vapor deposition process. The gate insulating layer may generally be made of silicon nitride, or may be made of silicon oxide, or may be made of silicon oxynitride, or the like.

Step 302: forming a source-drain metal pattern that is made of a preset metal on the base substrate, on which the gate insulating layer is formed, the source-drain metal pattern including a source electrode and a drain electrode and the preset metal including at least copper.

Figure 5:
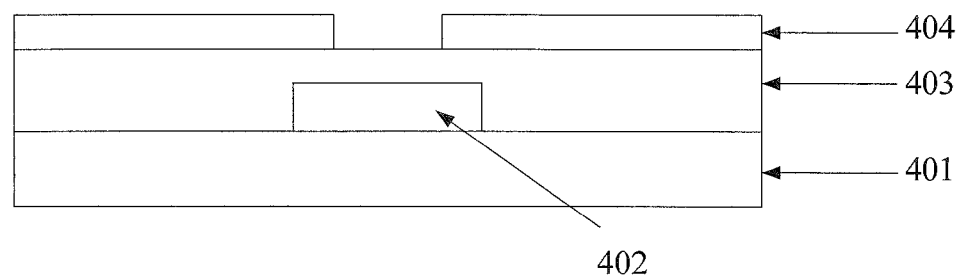
FIG. 5 is a schematic structural view showing a process of manufacturing a source-drain metal pattern according to an embodiment of the present invention.

In an example, as shown in FIG. 5, a double-layer-structure metal layer is deposited on the base substrate 401, on which the gate insulating layer 403 is formed, as the source electrode and the drain electrode and conducting wire required, so as to form a source-drain metal pattern 404 that is made of the preset metal. The gate metal pattern is denoted by 402 in FIG. 5.

In an example, step 302 may include: forming a barrier layer on the base substrate, on which the gate insulating layer is formed; forming a copper metal layer on the base substrate, on which the barrier layer is formed; and forming the source-drain metal pattern in the copper metal layer and the barrier layer. As an example, the barrier layer may be made of molybdenum-niobium alloy.

Step 303: forming a silicon nitride layer and a silicon oxide layer in turn over the base substrate, on which the source-drain metal pattern is formed, the silicon nitride layer and the silicon oxide layer composing a passivation layer.

Figure 6:
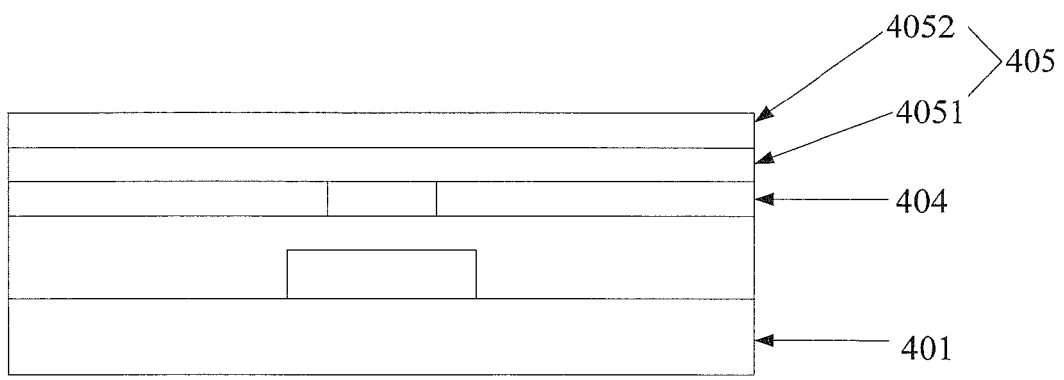
FIG. 6 is a schematic structural view showing a process of manufacturing a passivation layer according to an embodiment of the present invention.

In an example, as shown in FIG. 6, a silicon nitride layer 4051 and a silicon oxide layer 4052 are directly sequentially deposited over the base substrate 401, on which the source-drain metal pattern 404 is formed, the silicon nitride layer 4051 and the silicon oxide layer 4052 composing a passivation layer 405.

Step 304: coating photoresist over the base substrate, on which the passivation layer is formed.

Figure 7:
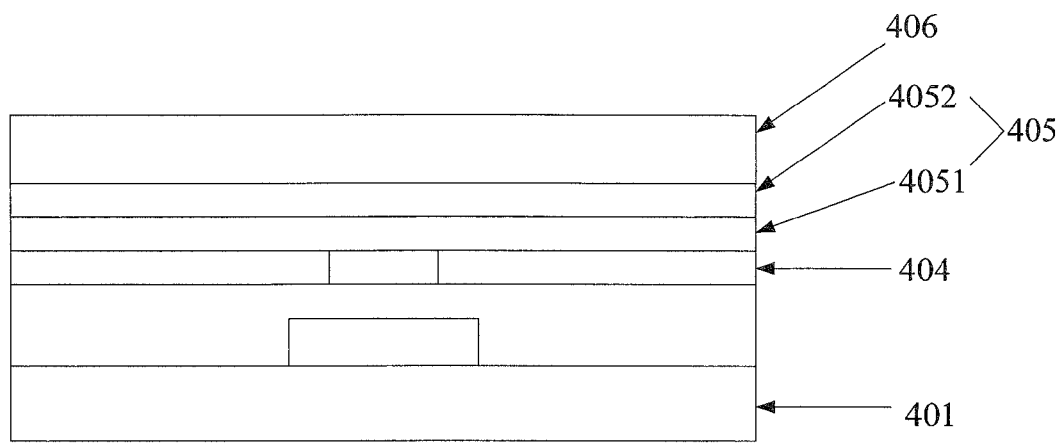
FIG. 7 is a schematic structural view of a base substrate coated with photoresist according to an embodiment of the present invention.

In an example, as shown in FIG. 7, after deposition of the passivation layer, photoresist 406 is coated on the base substrate 401, on which the passivation layer 405 is formed. The reference numbers in FIG. 7 may be referred to FIG. 6.

Step 305: performing exposure and development processes on a portion of the photoresist directly above or at a position corresponding to a gap between the source electrode and the drain electrode, obtaining a trench pattern.

In an example, a portion of the photoresist within a region where at a position corresponding to a gap between the source electrode and the drain electrode as shown in FIG. 7 is located is exposed and developed, obtaining a trench pattern.

Step 306: etching the passivation layer to form a trench in the passivation layer.

Wherein, a width of the trench in the silicon oxide layer is smaller than a width of the trench in the silicon nitride layer, and the width of the trench in the silicon oxide layer is larger than or equal to a width of the gap between the source electrode and the drain electrode.

Figure 8:
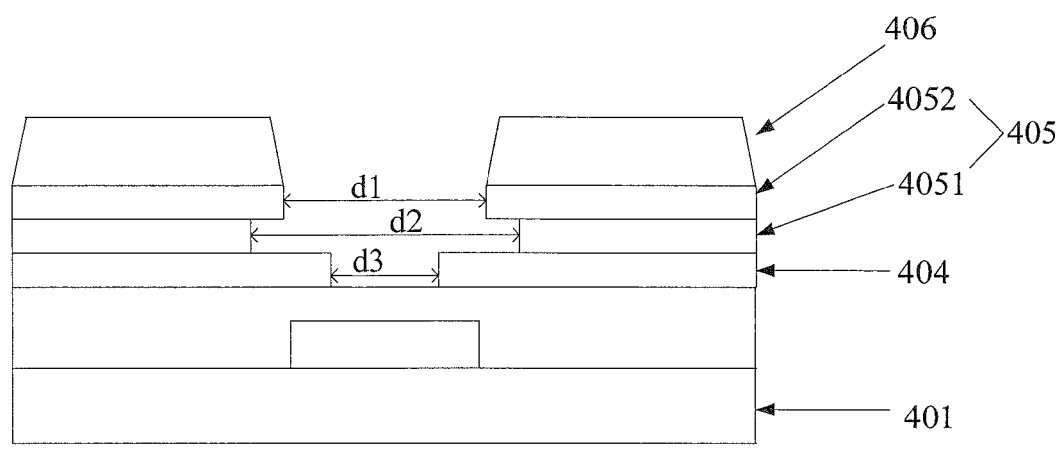
FIG. 8 is a schematic structural view showing a process of manufacturing a trench in the passivation layer according to an embodiment of the present invention.

In an example, as shown in FIG. 8, the passivation layer is etched. As an example, a dry etching process may be performed on the passivation layer so as to form the trench in the passivation layer. As the passivation layer 405 has a lower layer of the silicon nitride layer 4051 and an upper layer of silicon oxide layer 4052, a high etching selection ratio of the silicon nitride to the silicon oxide may render the passivation layer having a reverse T-type trench structure after the dry etching process. As shown in FIG. 8, a width d1 of a portion of the trench in the silicon oxide layer 4052 is smaller than a width d2 of a portion of the trench in the silicon nitride layer 4051. Herein, an etching speed is referred to an etching depth per unit time. Different materials involve different etching speeds as they have different sensitivities for etching gases. The etching selection ratio is defined as a ratio for etching speed between different films or layers made of different materials. According to requirements of a product in some cases, the width d1 of the trench in the silicon oxide layer 4052 may be larger than or equal to a width d3 of the gap between the source electrode and the drain electrode, as shown in FIG. 8. Other reference numbers in FIG. 8 may be referred to FIG. 7.

Etching technology that is applied to the passivation layer means that a photoresist pattern produced after development is exactly transferred in a replication way to a material under the photoresist pattern to form a pattern that is defined by a photolithograph technology. The etching technology may be sorted into two types, i.e., dry etching and wet etching. The dry etching means an etching technology that involves generating charged particles that include ions, electrons, etc., and plasma that includes neutral atoms, molecules and free radicals with high chemical activity, by using a glow discharge process, so as to carry out a pattern transfer.

It should be noted that the passivation layer may function for flattening or the like as it is just etched to have a trench region and the rest region thereof is still maintained as an entire passivation layer. Further, as the passivation layer is manufactured in advance and has a dense lower layer of the silicon nitride, the copper may be prevented from oxidation during directly depositing Indium-Gallium-Zinc-Oxygen (InGaZnO, IGZO for short) as the oxide active layer on the source-drain metal pattern for a conventional coplanar structure.

Step 307: forming an oxide trench pattern on the source-drain metal pattern, so that the oxide trench pattern is not in contact with the silicon nitride layer.

Figure 9:
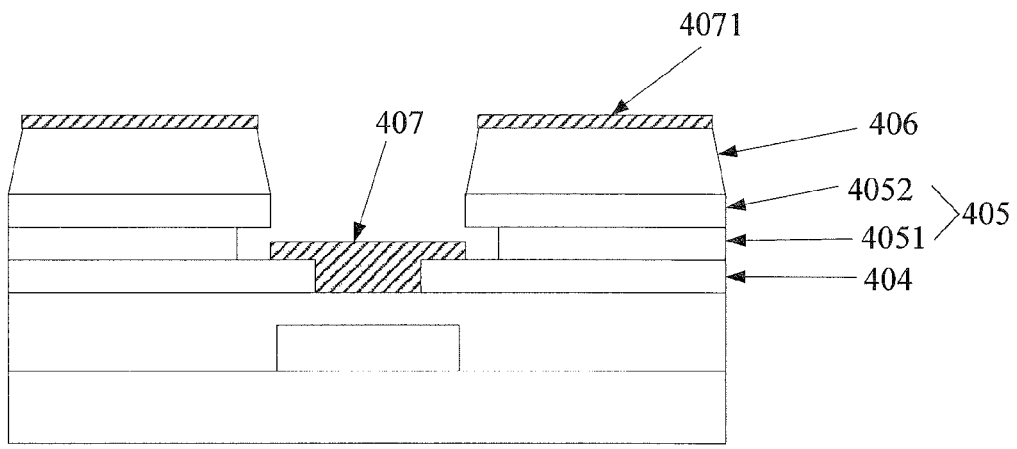
FIG. 9 is a schematic structural view showing a process of manufacturing an oxide trench pattern according to an embodiment of the present invention.

In an example, as shown in FIG. 9, after the trench region is formed by dry etching, an oxide active layer of IGZO is directly formed in situation where the photoresist 406 exists, such that an oxide trench pattern 407 is formed on the source-drain metal pattern 404. As the reverse T-type trench structure is formed in the passivation layer 405 after dry etching, the deposited oxide active layer has a width equal to a width of the trench in the silicon oxide layer 4052 as the upper layer of the passivation layer 405. That is, the oxide trench pattern 407 cannot be in contact with the silicon nitride layer 4051, which thus may ensure the oxide trench pattern 407 to be not affected by the silicon nitride layer 4051. In FIG. 9, the IGZO provided on the photoresist 406 is denoted by 4071.

Step 308: peeling off the photoresist.

Figure 10:
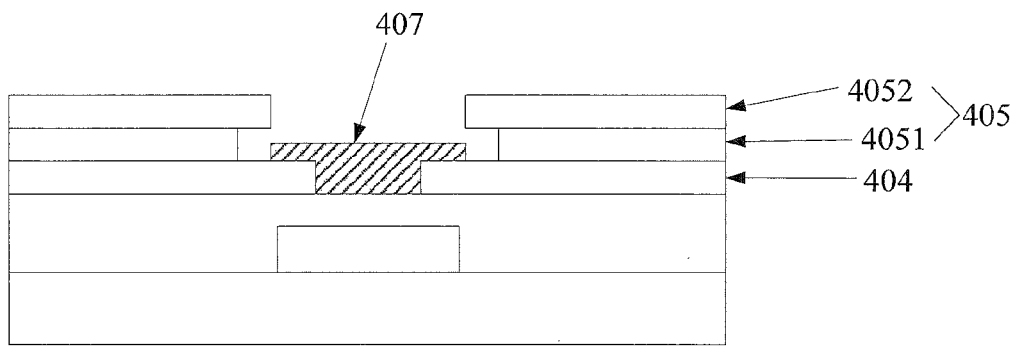
FIG. 10 is a schematic structural view of a base substrate with the photoresist having been peeled off according to an embodiment of the present invention.

As shown in FIG. 10, the photoresist on the passivation layer 405 is peeled off through a peel-off process, and meanwhile the IGZO is removed. Other reference numbers in FIG. 10 may be referred to FIG. 9.

Step 309: forming an organic film over the base substrate, on which the oxide trench pattern is formed.

Figure 11:
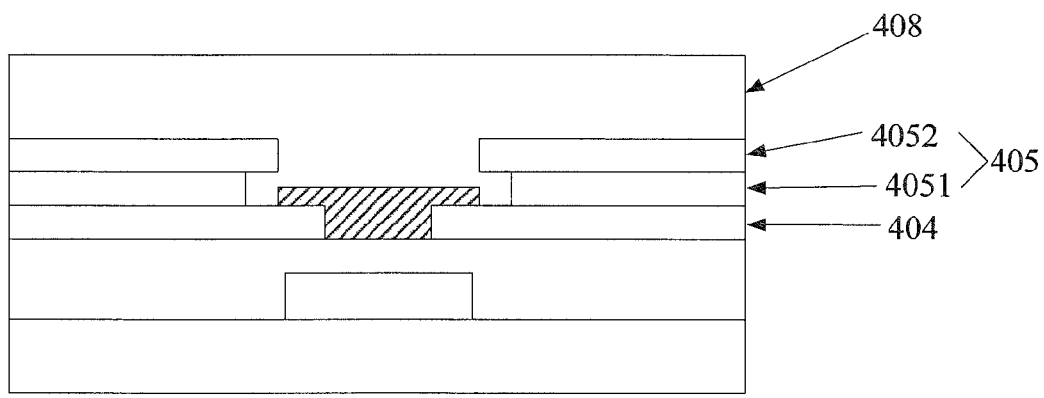
FIG. 11 is a schematic structural view of a base substrate with an organic film according to an embodiment of the present invention.

In an example, as shown in FIG. 11, after peeling off the photoresist, an organic film 408 is coated on the passivation layer 405 so as to form a flat surface, and thus fracture will not easily occur in a pixel electrode during subsequently manufacturing the pixel electrode from Tin doped Indium Oxide (also termed as Indium Tin Oxide, ITO for short). To this, the entire manufacturing process is completed. Other reference numbers in FIG. 11 may be referred to FIG. 10.

It is needed to additionally note that an existing array substrate in coplanar structure is obtained by firstly forming a source-drain metal pattern and then forming an oxide trench pattern. Thus, the formation of this structure is left out a lithographic process when compared to that of the etch stop layer (ESL) structure, and is similar to that of a traditional back trench etch (BCE) structure. However, compared to the BCE structure, this coplanar structure has a higher freedom in material selection for the oxide trench pattern, and is not necessary to select an oxide material that may withstand source-drain metal etchant, such as Indium-Tin-Zinc-Oxygen (InSnZnO, ITZO for short). Thus, this coplanar structure may ensure reducing process complexity while being capable of being manufactured by a conventional material of IGZO. As the method of manufacturing the array substrate according to embodiments of the present invention is improved based on the existing array substrate structure, the structure of the array substrate according to embodiments of the present invention is also advantageous over the traditional ESL structure and BCE structure in terms of process complexity and convenience.

According to the method of manufacturing an array substrate provided in embodiments of the present invention, the passivation layer is directly formed on the source-drain metal pattern and includes the lower layer of the silicon nitride layer and the upper layer of the silicon oxide, then the trench region is etched in the passivation layer by a dry etching process, and next, the oxide trench pattern is formed. In this way, the silicon nitride layer of the passivation layer is used to protect copper metal layer from oxidation while no additional process is added. Further, during forming the trench region by performing the dry etching process at a corresponding position of the passivation layer, as the reverse T-type trench structure may be formed after dry etching due to the passivation layer including the silicon nitride layer as the lower layer thereof and the silicon oxide layer as the upper layer thereof, the oxide trench pattern may be spaced from the silicon nitride layer by a distance during subsequent deposition of the oxide active layer and forming the oxide trench pattern, thereby avoiding hydrogen in the silicon nitride from affecting the oxide trench pattern and improving display characteristic of the array substrate.

A still advantage of the method of manufacturing the array substrate resides in reduced complexity of the process and its cost, as the oxide active layer of IGZO may be directly deposited on the photoresist and the oxide trench pattern of IGZO may be formed by only a peeling-off process without etching due to usage of the photoresist during performing the dry etch process to form the trench region in the passivation layer.

In sum, the method of manufacturing an array substrate provided by the embodiments of the present invention may avoid the copper metal layer from being completely exposed to an oxygen enriched environment to be oxidized and ensure the copper metal layer to be not in contact with the silicon oxide layer, thereby eliminating oxidation of the copper metal layer, by firstly forming the passivation layer on the source-drain metal pattern and then forming the oxide trench pattern, and by further modifying the structure of the passivation layer to include the silicon nitride layer as the lower layer and the silicon oxide layer as the upper layer. Further, it may ensure the oxide trench pattern to be not in contact with the silicon oxide layer, avoid influence on display characteristic of the array substrate, and thus eliminate oxidation of the copper metal layer and improve display performance of the array substrate, by forming the trench in the passivation layer at a position corresponding to the gap between the source electrode and the drain electrode so that the width of the trench in the silicon oxide layer is smaller than the width of the trench in the silicon nitride layer and is larger than or equal to the width of the gap between the source electrode and the drain electrode.

Figure 12:
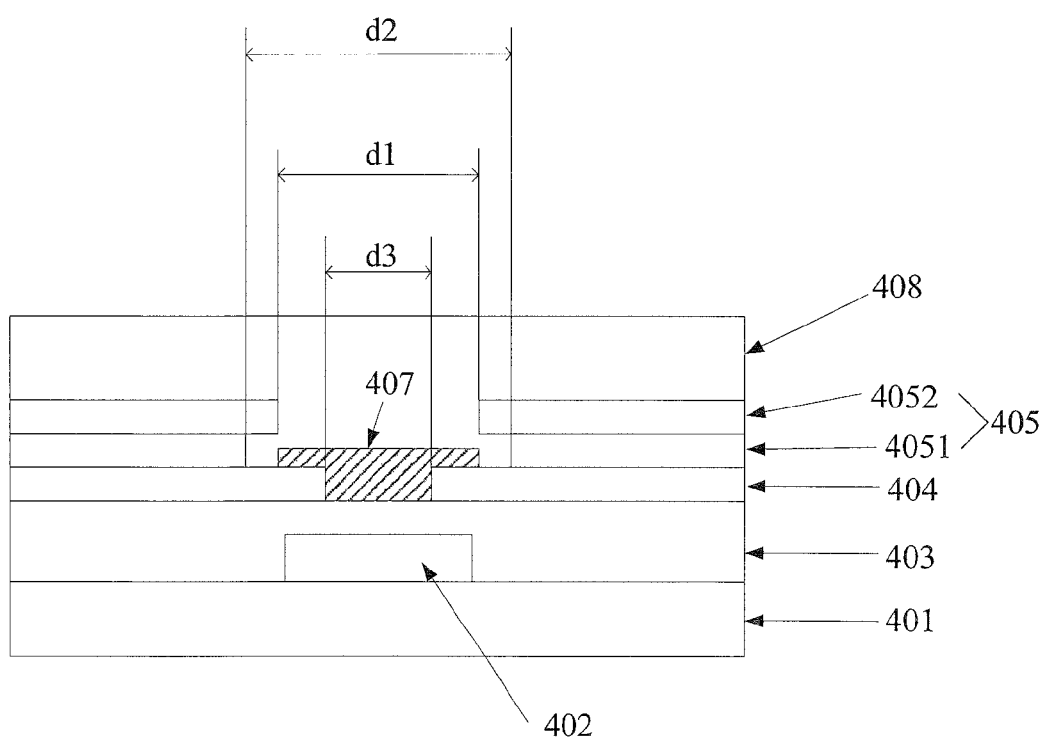
FIG. 12 is a schematic structural view of an array substrate according to an embodiment of the present invention.

Embodiments of the present invention further provide an array substrate. As shown in FIG. 12, the array substrate may include:

a base substrate 401; a gate metal pattern 402 and a gate insulating layer 403 formed on the base substrate 401; a source-drain metal pattern 404, which is made of preset metal and is formed on the base substrate 401 formed with the gate insulating layer 403, the source-drain metal pattern including a source electrode and a drain electrode and the preset metal including at least copper; a passivation layer 405 composed by a silicon nitride layer 4051 and a silicon oxide layer 4052, the silicon nitride layer 4051 and the silicon oxide layer 4052 being formed in turn over the base substrate 401 formed with the source-drain metal pattern 404; wherein, a trench is formed in the passivation layer 405 at a position corresponding to the gap between the source electrode and the drain electrode, and wherein, a width d1 of a trench in the silicon oxide layer 4052 is smaller than a width d2 of the trench in the silicon nitride layer 4051 and the width d1 of the trench in the silicon oxide layer 4052 is larger than or equal to a width d3 of the gap between the source electrode and the drain electrode. The array substrate further includes an oxide trench pattern 407, which is formed on the source-drain metal pattern 404 and is not in contact with the silicon nitride layer 4051, and an organic film 408, formed on the base substrate 401 on which the oxide trench pattern 407 is formed.

In sum, the array substrate provided by embodiments of the present invention may avoid the copper metal layer from being completely exposed to an oxygen enriched environment to be oxidized and ensure the copper metal layer to be not in contact with the silicon oxide layer, thereby eliminating oxidation of the copper metal layer, by firstly forming the passivation layer on the source-drain metal pattern and then forming the oxide trench pattern, and by further modifying the structure of the passivation layer to include the silicon nitride layer as the lower layer and the silicon oxide layer as the upper layer. Further, it may ensure the oxide trench pattern to be not in contact with the silicon oxide layer, avoid influence on display characteristic of the array substrate, and thus eliminate oxidation of the copper metal layer and improve display performance of the array substrate, by forming the trench in the passivation layer at a position corresponding to the gap between the source electrode and the drain electrode, in which the width of the trench in the silicon oxide layer is smaller than the width of the trench in the silicon nitride layer and is larger than or equal to the distance of the gap between the source electrode and the drain electrode.

It is needed to additionally describe that the base substrate, on which the gate insulating layer is formed, may be formed with the barrier layer thereon; the base substrate, on which the barrier layer is formed, may formed with the copper metal layer thereon; and the source-drain metal pattern are formed in the barrier layer and the copper metal layer. As an example, the barrier layer may be made of molybdenum-niobium alloy.

Embodiments of the present invention also provide a display device, which may include the array substrate as shown in FIG. 12.

In sum, the array substrate of the display device provided by embodiments of the present invention may avoid the copper metal layer from being completely exposed to oxygen enriched environment to be oxidized and ensure the copper metal layer to be not in contact with the silicon oxide layer, thereby eliminating oxidation of the copper metal layer, by firstly forming the passivation layer on the source-drain metal pattern and then forming the oxide trench pattern, and by further modifying the structure of the passivation layer to include the silicon nitride layer as the lower layer and the silicon oxide layer as the upper layer. Further, it may ensure the oxide trench pattern to be not in contact with the silicon oxide layer, avoid influence on display characteristic of the array substrate, and thus eliminate oxidation of the copper metal layer and improve display performance of the array substrate, by forming the trench in the passivation layer at a position corresponding to the gap between the source electrode and the drain electrode, so that the width of the trench in the silicon oxide layer is smaller than the width of the trench in the silicon nitride layer and is larger than or equal to the width of the gap between the source electrode and the drain electrode.

The above described is only preferable embodiments of the present invention, but is not intended to limit the present invention. Any modifications, equivalent replacements or improvements that are made within inspirit and principle of the present invention should be included in the protective scope of the present invention.

The invention claimed is:

1. A method of manufacturing an array substrate, comprising steps of:
    forming a gate metal pattern and a gate insulating layer in turn on a base substrate;
    forming a source-drain metal pattern from a preset metal on the base substrate, on which the gate insulating layer is formed, the source-drain metal pattern comprising a source electrode and a drain electrode and the preset metal comprising at least copper;
    forming a silicon nitride layer and a silicon oxide layer in turn on the base substrate, on which the source-drain metal pattern is formed, the silicon nitride layer and the silicon oxide layer composing a passivation layer;
    forming a trench in the passivation layer at a position corresponding to a gap between the source electrode and the drain electrode, wherein a width of a portion of the trench in the silicon oxide layer is smaller than a width of a portion of the trench in the silicon nitride layer and is larger than or equal to a distance of the gap between the source electrode and the drain electrode;
    forming an oxide trench pattern on the source-drain metal pattern, the oxide trench pattern being not in contact with the silicon nitride layer; and
    forming an organic film over the base substrate, on which the oxide trench pattern is formed.

2. The method according to claim 1, wherein
    the step of forming a trench in the passivation layer at a position corresponding to a gap between the source electrode and the drain electrode comprises:
    coating a photoresist over the base substrate, on which the passivation layer is formed;
    performing exposure and development on the photoresist above the gap between the source electrode and the drain electrode through the photoresist to obtain a trench pattern; and
    forming the trench in the passivation layer by etching the passivation layer;
    the method further comprises:
    peeling off the photoresist after forming the oxide trench pattern on the source-drain metal pattern.

3. The method according to claim 2, wherein the step of forming the trench in the passivation layer by etching the passivation layer comprises:
    forming the trench in the passivation layer by performing dry etching process on the passivation layer.

4. The method according to claim 1, wherein the step of forming a source-drain metal pattern from a preset metal on the base substrate, on which the gate insulating layer is formed, comprises:
    forming a barrier layer on the base substrate, on which the gate insulating layer is formed;
    forming a copper metal layer on the base substrate, on which the barrier layer is formed; and
    forming the source-drain metal pattern in the barrier layer and the copper metal layer.

5. The method according to claim 4, wherein the barrier layer is made of molybdenum-niobium alloy.

6. An array substrate, comprising:
    a base substrate;
    a gate metal pattern and a gate insulating layer formed on the base substrate;
    a source-drain metal pattern made of a preset metal and formed on the base substrate, on which the gate insulating layer is formed, the source-drain metal pattern including a source electrode and a drain electrode and the preset metal including at least copper;

a silicon nitride layer and a silicon oxide layer formed in turn over the base substrate, on which the source-drain metal pattern is formed, the silicon nitride layer and the silicon oxide layer composing a passivation layer;

a trench formed in the passivation layer at a position corresponding to a gap between the source electrode and the drain electrode, wherein a width of a portion of the trench in the silicon oxide layer is smaller than a width of a portion of the trench in the silicon nitride layer and is larger than or equal to a width of the gap between the source electrode and the drain electrode;

an oxide trench pattern formed on the source-drain metal pattern and being not in contact with the silicon nitride layer; and an organic film formed over the base substrate, on which the oxide trench pattern is formed.

7. The array substrate according to claim 6, further comprising:

a barrier layer formed over the base substrate, on which the gate insulating layer is formed; and a copper metal layer formed over the base substrate, on which the barrier layer is formed;

wherein the source-drain metal pattern are formed in the barrier layer and the copper layer.

8. The array substrate according to claim 7, wherein the barrier layer is made of molybdenum-niobium alloy.

9. A display device, comprising the array substrate according to claim 6.

* * * * *